United States Patent
Kesler

(10) Patent No.: US 8,760,215 B2
(45) Date of Patent: Jun. 24, 2014

(54) THRESHOLD VOLTAGE BASED POWER TRANSISTOR OPERATION

(75) Inventor: Scott B. Kesler, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 13/525,440

(22) Filed: Jun. 18, 2012

(65) Prior Publication Data
US 2013/0015889 A1    Jan. 17, 2013

Related U.S. Application Data

(60) Provisional application No. 61/508,108, filed on Jul. 15, 2011.

(51) Int. Cl.
*H03K 17/567* (2006.01)
*G05F 1/10* (2006.01)
*H03K 17/30* (2006.01)
*H03K 17/16* (2006.01)
*G01R 31/26* (2014.01)

(52) U.S. Cl.
CPC ............. *H03K 17/168* (2013.01); *H03K 17/30* (2013.01); *G01R 31/2616* (2013.01)
USPC .......................................... 327/432; 327/109

(58) Field of Classification Search
None
See application file for complete search history.

(56) References Cited

U.S. PATENT DOCUMENTS

| | | | |
|---|---|---|---|
| 6,323,717 B1 * | 11/2001 | Omura et al. | 327/434 |
| 7,675,346 B2 | 3/2010 | Kesler | |
| 8,004,317 B2 * | 8/2011 | Palmer et al. | 327/108 |
| 8,203,366 B2 * | 6/2012 | Lee | 327/108 |
| 2007/0200602 A1 | 8/2007 | Ishikawa et al. | |
| 2012/0032710 A1 * | 2/2012 | Tsukada | 327/109 |

FOREIGN PATENT DOCUMENTS

| | | |
|---|---|---|
| EP | 2 424 112 A1 | 2/2012 |
| WO | 2008/032113 A1 | 3/2008 |

OTHER PUBLICATIONS

Ivan Bahun et al: "Real-Time Measurement of IGBT's Operating Temperature", Journal for Control, Measurement, Electronics, Computing and Communications, vol. 52, No. 4, Dec. 31, 2011, pp. 295-305, XP055087873, ISSN: 0005-1144.
European Search Report dated Nov. 14, 2013.

* cited by examiner

*Primary Examiner* — Lincoln Donovan
*Assistant Examiner* — Terry L Englund
(74) *Attorney, Agent, or Firm* — Lawrence D. Hazelton

(57) ABSTRACT

A system and method for operating a power transistor. Parasitic impedances naturally present in a circuit board or other interconnect structures exhibit a parasitic impedance effective to generate a parasitic voltage signal in response to operating the power transistor. The parasitic voltage signal is monitored in order to better control the power transistor. In particular, the threshold voltage of the power transistor can be determined and used to more optimally control the power transistor.

16 Claims, 3 Drawing Sheets

THRESHOLD VOLTAGE BASED POWER TRANSISTOR OPERATION

CROSS-REFERENCE TO RELATED APPLICATION

This application claims the benefit under 35 U.S.C. §119(e) of U.S. Provisional Patent Application No. 61/508,108, filed Jul. 15, 2011, the entire disclosure of which is hereby incorporated herein by reference.

TECHNICAL FIELD OF INVENTION

This disclosure generally relates to operating a power transistor, and more particularly relates to a way to learn the threshold voltage of a power transistor and use that threshold voltage to operate the power transistor.

BACKGROUND OF INVENTION

Power transistors such as Metal Oxide Semiconductor Field Effect transistors (MOSFET) and Insulated Gate Bipolar Power transistors (IGBT) are used to switch high currents in devices such as internal combustion engine spark-ignition controllers, electric motor controllers, power inverters, and DC-DC converters. These types of power transistors are characterized as having control input threshold voltage (e.g. gate threshold voltage) that varies with temperature, and vary from part to part due to manufacturing variations. Knowing the threshold voltage levels for each of one or more individual power transistor in these devices, and being able to track changes in the threshold voltages as their operating temperatures vary provides a means for more optimal control of the power transistors switching characteristics such as voltage or current slew rates, off-to-on and on-to-off transitions times, or predicting the instant when the power transistor current starts and stops. Optimizing the control of power transistors has become particularly important as power transistor power handling and switching frequency capability continue to increase. Examples of how a threshold voltage is used to operate a power transistor are given in U.S. Pat. No. 7,675,346 issued Mar. 9, 2010 to Kesler, the entire contents of which are hereby incorporated by reference herein.

SUMMARY OF THE INVENTION

In accordance with one embodiment, a system for operating a power transistor is provided. The system includes a power transistor, a circuit board, and a controller. The power transistor defines a gate contact, a collector contact, and an emitter contact. The power transistor is characterized as having a threshold voltage. The circuit board defines a control signal path electrically coupled to the gate contact, an input signal path electrically coupled to the collector contact, and an output signal path electrically coupled to the emitter contact. The output signal path is characterized as having a parasitic impedance effective to generate a parasitic voltage signal in response to operating the power transistor. The controller is electrically connected to the circuit board in a manner effective to determine a parasitic voltage value based on the parasitic voltage signal. The controller is configured to output a control signal effective to operate the power transistor based on the parasitic voltage value.

In another embodiment, a method for operating a power transistor is provided. The method includes the step of providing a power transistor that defines a gate contact, a collector contact, and an emitter contact. The power transistor is characterized as having a threshold voltage. The method also includes the step of providing a circuit board that defines a control signal path electrically coupled to the gate contact, an input signal path electrically coupled to the collector contact, and an output signal path electrically coupled to the emitter contact. The output signal path is characterized as having a parasitic impedance effective to generate a parasitic voltage signal in response to operating the power transistor. The method also includes the step of sensing the parasitic voltage signal when the power transistor is operated in response to a control signal. The method also includes the step of operating the power transistor based on the parasitic voltage signal.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
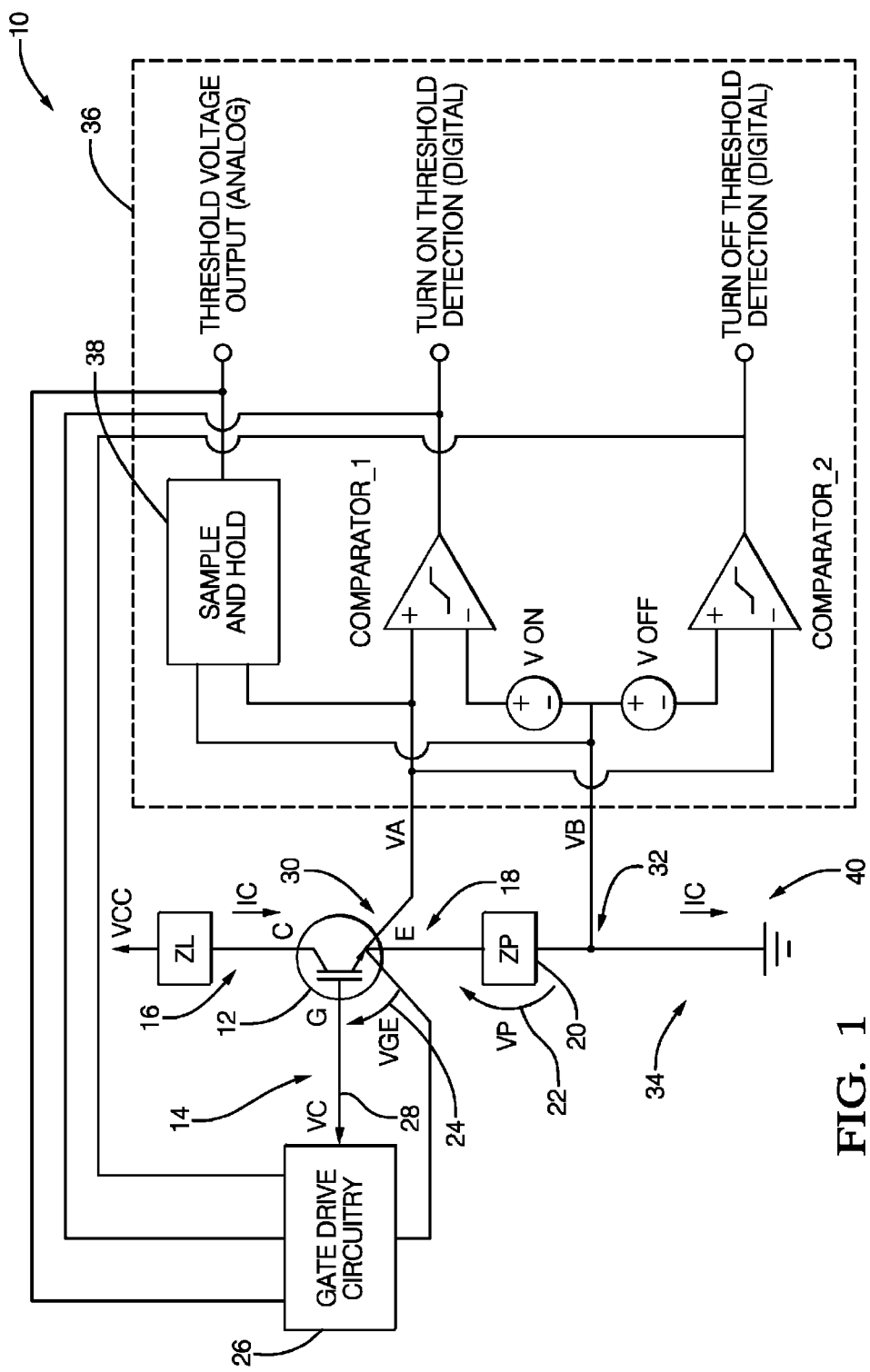
FIG. 1 is a diagram of a system for operating a power transistor in accordance with one embodiment.

FIG. 1 illustrates a non-limiting example of a system 10 for operating a power transistor 12. The power transistor 12 is illustrated as an insulated gate bi-polar transistor (IGBT); however those in the art will recognize that the power transistor 12 could suitably be a metal oxide semiconductor field effect transistor (MOSFET). As used herein, the term power transistor generally refers to transistors that are rated to dissipate a significant amount of power, more than one watt (1 W) at room temperature (25° C.) for example, and are typically individually packaged. As such, signal level transistors that do not dissipate significant power are excluded. The teachings set forth herein address problems associated with high speed switching of power transistors that were only recently recognized. That is, prior power transistor operation was such that the effects of the parasitic impedances present in interconnect structures such as circuit board conductors, wire bonds, package leads, and the like could be ignored. However, recent increases in switching speeds and current levels now may cause these parasitic impedances to have a significant effect on power transistor operation.

In general, the power transistor 12 defines a gate contact G, a collector contact C, and an emitter contact E. These contacts are typically metallized pads on the surface of the semiconductor material forming the die of the power transistor 12. It is well known that transistor types such as IGBT and MOSFET exhibit a characteristic commonly referred to as a threshold voltage that is a gate-to-emitter voltage 24 (VGE) at which collector current IC begins to flow between the collector C and the emitter E of the power transistor 12.

The system 10 may include a circuit board 40 or other interconnect structure that defines a control signal path 14 electrically coupled to the gate contact G, an input signal path 16 electrically coupled to the collector contact C, and an output signal path 18 electrically coupled to the emitter contact E. While various features of the circuit board 40 is not specifically illustrated, they are well known. It is recognized that all of the signal paths generally exhibit some sort of electrical impedance characteristic. However, for the purpose of simplifying explanation and illustration, only the electrical impedance characteristic of the output signal path 18 will be further considered in the description that follows. As such, the output signal path 18 may be characterized as having a parasitic impedance 20 (ZP) that may generate a parasitic voltage signal 22 (VP) in response to operating the power transistor 12. It should be understood that the parasitic impedance 20 (ZP) does not arise from including electrical components such as resistors or inductors in the output signal path 18, but are naturally occurring phenomena of, for example a length of conductive material such as a circuit board trace, wire bond, or lead frame.

The system 10 may include gate drive circuitry, or more generally a controller 26, electrically connected to the circuit board 40 or interconnect structure in a manner effective to determine a parasitic voltage value based on the parasitic voltage signal 22. The illustration suggests that the electrical connection from the controller 26 to the emitter contact E is isolated from the effects of the collector current IC flowing through the output signal path 18 only for the purpose of explanation. While it is preferable to have an isolated connection, for example by way of a second wire bond to the die of the power transistor 12, it will become apparent in the description that follows that an isolated connection it is not a requirement. For example, if the electrical connection to the controller 26 is not made directly to the emitter contact E, but the connection is made somewhere along the output signal path 18, then the effects of any significant impedances influencing the value of the gate-to-emitter voltage 24 (VGE) could be accounted for by the controller 26 so that the power transistor 12 is optimally operated.

The controller 26 may include a processor such as a microprocessor or other control circuitry as should be evident to those in the art. The controller 26 may include memory, including non-volatile memory, such as electrically erasable programmable read-only memory (EEPROM) for storing one or more routines, thresholds and captured data. The one or more routines may be executed by the processor to perform steps for receiving signals for operating the power transistor 12 as described herein. The controller 26 may also be configured to output a control signal 28 (VC) effective to operate the power transistor 12 based on the parasitic voltage value of the parasitic voltage signal 22 (VP). For example, the controller 26 may be configured to determine a threshold voltage VT (FIG. 2) of the power transistor 12 based on the parasitic voltage value of the parasitic voltage signal 22 (VP) and a control signal value of the a control signal 28 (VC) or the gate-to-emitter voltage 24 (VGE). The gate drive circuitry aspect of the controller 26 may include any circuitry that provides the function of charging and discharging the gate of the power transistor 12.

By way of example and not limitation, the parasitic impedance 20 (ZP) may include an inductance portion or inductive characteristic. As the switching speeds of power transistors increases, the inductive portion of the parasitic impedance 20 (ZP) becomes more significant, and for this system may be viewed as desirable because the inductive portion provides a useful indication that the collector current IC is changing, but does not contribute to power loss as would be the case if the parasitic impedance 20 (ZP) were predominately resistive in nature. In other words, if the parasitic impedance 20 (ZP) is predominantly or at least substantially inductive in nature, the parasitic voltage signal 22 (VP) is generally indicative of a rate of change of the collector current IC.

As the parasitic impedance 20 (ZP) is generally inherently present in the interconnect structure forming the output signal path 18, the system 10 may be configured to measure or monitor the parasitic voltage signal 22 (VP) by providing a first contact 30 so that a first sensing signal VA is available, and a second contact 32 so that a second sensing signal VB is available. In general, the second contact 32 is spaced electrically apart from the first contact 30 by a portion of the output signal path 18. As used herein, spaced electrically apart means that there is an impedance interposed between the two contacts, indicated in this disclosure by the parasitic impedance 20 (ZP). As such, the parasitic impedance 20 (ZP) is generally determined by the portion of the output signal path 18 between the first contact 30 and the second contact 32. The output signal path 18 may include a ground return path 34 that may or may not exhibit a significant impedance value. It is noted that even if the ground return path 34 also exhibits an impedance that is not included in the parasitic impedance 20 (ZP), the differential measurement of the parasitic voltage signal 22 (VP) by way of measuring the first sensing signal VA relative to the second sensing signal VB is still useful to control the power transistor 12.

As described above, it is preferable that the first contact 30 be electrically close to the emitter contact E so that the first sensing signal VA does not include signal contributions from interconnect impedances. Since the first sensing signal VA and the emitter signal from the controller 26 to the power transistor 12 are typically very low current, the connections to the emitter contact E may be shared by these two signals.

Continuing to refer to FIG. 1, the system 10 may include a threshold detector 36. In general, the threshold detector 36 is equipped with a comparator (COMPARATOR_1) configured to indicate when the voltage value of the parasitic voltage signal 22 (VP) is greater than a turn-on threshold value VON. The threshold detector 36 may also be equipped with another comparator (COMPARATOR_2) configured to indicate when the voltage value of the parasitic voltage signal 22 (VP) is less than a turn-off threshold value VOFF. The threshold detector may also include a sample and hold circuit 38 configured to periodically sample the parasitic voltage signal 22 (VP). It is recognized that the threshold detector 36 could be integrated into the controller 26. The threshold detector 36 is shown as separate only for the purpose of explanation.

The values used for VON and VOFF would typically be empirically determined. However, analysis and other considerations such as signal timing delays may also be used to select values for VON and VOFF.

Figure 2:
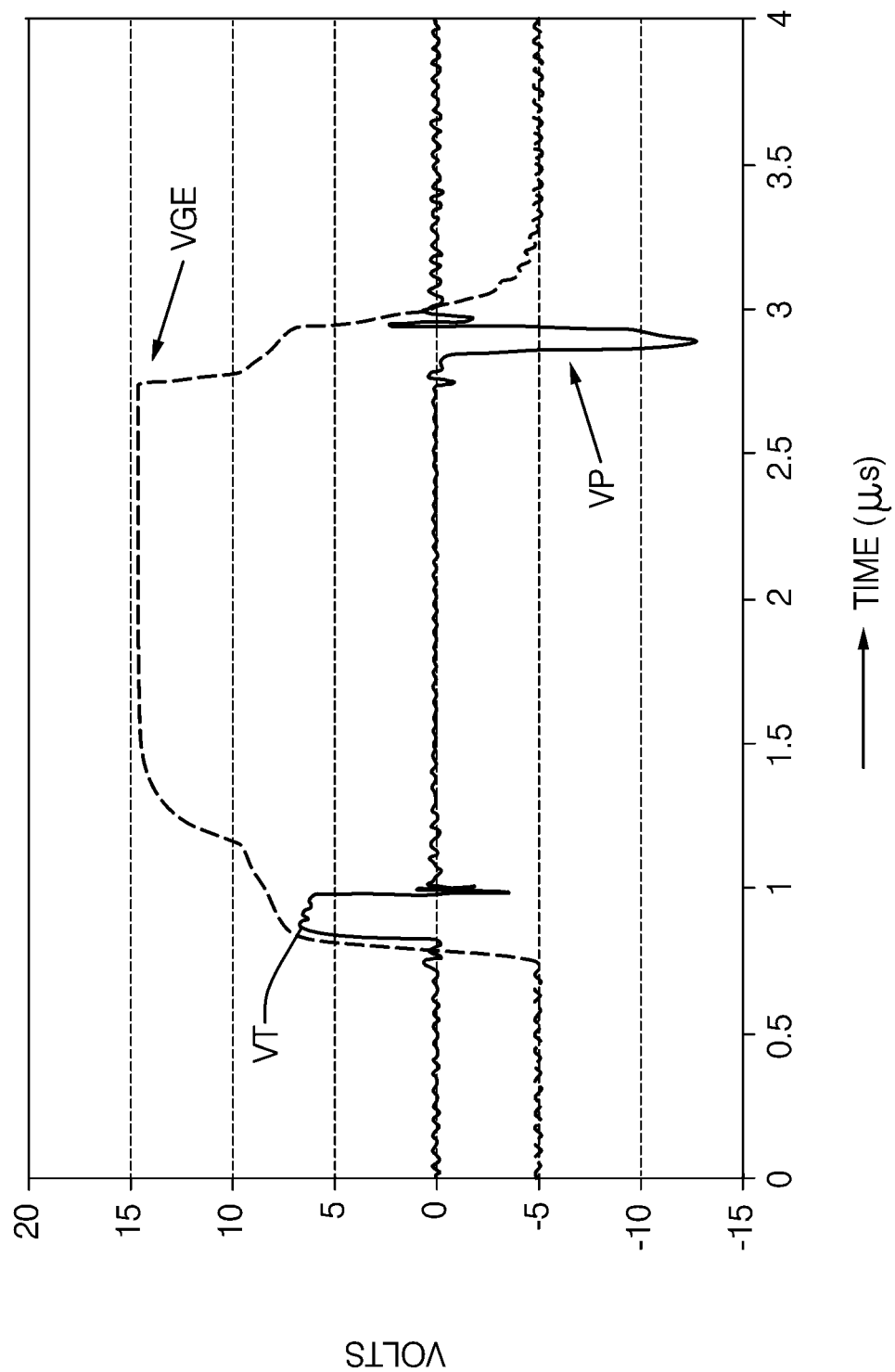
FIG. 2 is graph of signals present in the system of FIG. 1 in accordance with one embodiment.

FIG. 2 illustrates a non-limiting example of the gate-to-emitter voltage 24 (VGE) and the parasitic voltage signal 22 (VP) that can be present in the circuit shown in FIG. 1. VCC (FIG. 1) is about 300 Volts, and ZL is similar to a 1 Ohm resistor. As such, when the power transistor is turn-on, the steady state current will be around 300 Ampere assuming that the on-resistance of the power transistor 12 is not significant. At time=0, VGE is held at about −5 Volts for the purpose of assuring that unexpected electrical noise does not momentarily turn the power transistor 12 ON. At about time=0.75 microseconds (us), the controller 26 outputs a control signal 28 so VGE begins to rise. Soon VP begins to rise because the power transistor 12 begins to conduct collector current IC. As the collector current IC increases in value, VP also increases because the inductive nature of the parasitic impedance 20 (ZP) includes an inductive component of the characteristic impedance of about two nano-Henrys (2 nH).

It should be appreciated that these inductances are inherent in packaging and board layout and do not represent actual distinct components resulting in additional system cost or the introduction of additional, potentially undesirable resistive drops in the load current path. A suitable value for VON for this example circuit is 4 Volts, and so a threshold voltage VT of the power transistor may be about 6 Volts. Similarly, as the power transistor is being turned off, VP becomes negative because IC is decreasing. A suitable VOFF may be 5 Volts.

It is noted that the parasitic voltage signal 22 (VP) during the power transistor 12 turn-off event is uniquely different than that produced by the turn-on event, and so may be more detectable. By comparison to these inductively generated signals, conduction sensing signals developed by previously implemented resistive elements produce a signal that is proportional to the magnitude of the load currents and therefore may not produce a useable signal until some appreciable time after the start of conduction thereby introducing uncertainty as to when the conduction actually began or ended. This is especially true when the load is inductive in nature.

Figure 3:
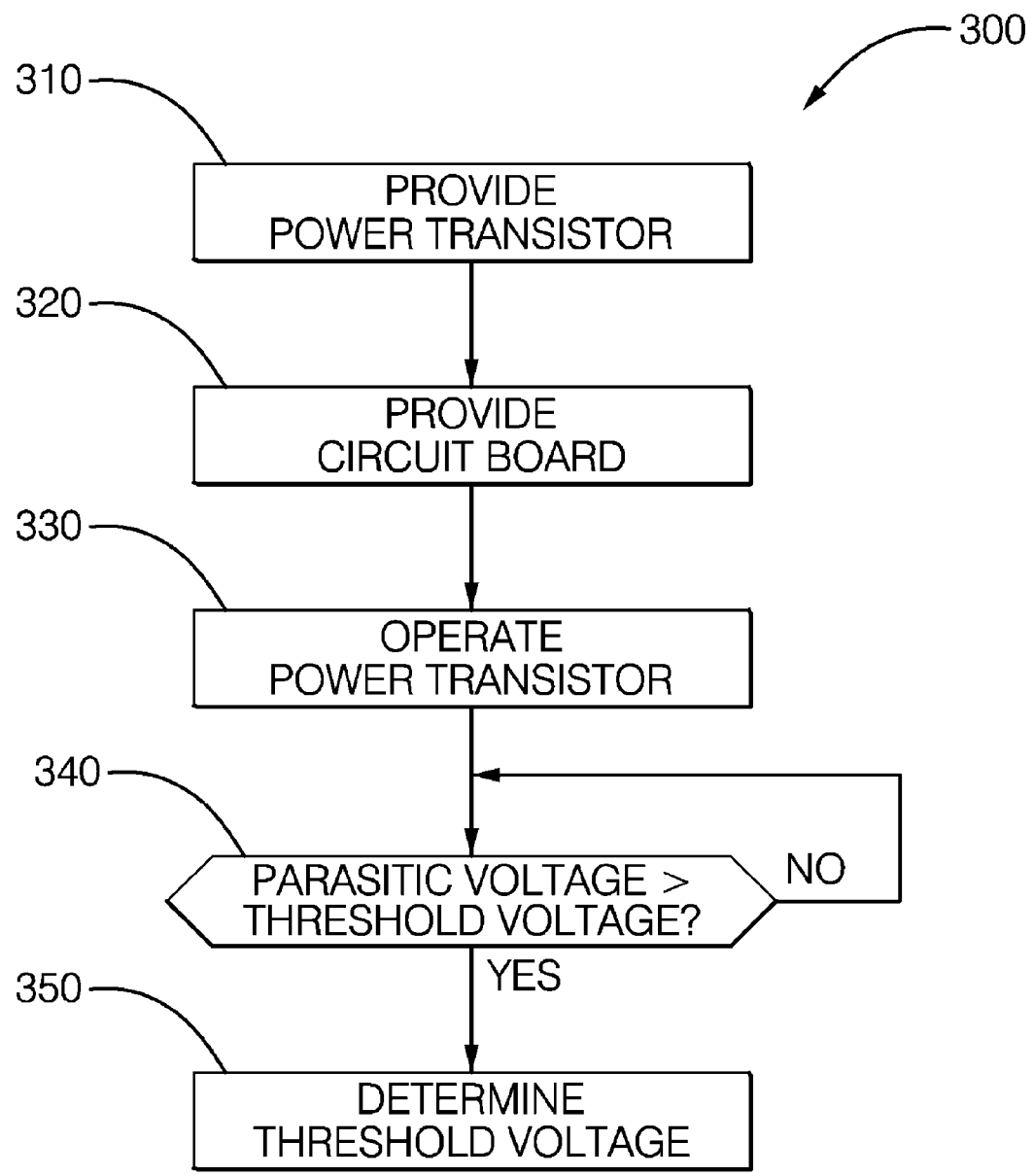
FIG. 3 is a flowchart of a method of operating the system of FIG. 1 in accordance with one embodiment.

FIG. 3 illustrates a non-limiting example of a method 300 operating the power transistor 12.

Step 310, PROVIDE POWER TRANSISTOR, may include providing a power transistor 12 that defines a gate contact G, a collector contact C, and an emitter contact E. The power transistor 12 may also be characterized as having a threshold voltage such as is the case for IGBTs and MOSFETs.

Step 320, PROVIDE CIRCUIT BOARD, may include providing a circuit board 40 or other interconnect structure that makes electrical contact with the power transistor 12. The circuit board 40 or interconnect structure may define a control signal path 14 electrically coupled to the gate contact G, an input signal path 16 electrically coupled to the collector contact C, and an output signal path 18 electrically coupled to the emitter contact E. The output signal path 18 is generally characterized as having a parasitic impedance 20 (ZP) effective to generate a parasitic voltage signal in response to operating the power transistor 12.

Step 330, OPERATE POWER TRANSISTOR, may include operating the power transistor 12 once without prior knowledge of a threshold voltage VT of the power transistor, and then subsequently with knowledge of the threshold voltage VT that was learned based on the parasitic voltage signal 22 (VP).

Step 340, PARASITIC VOLTAGE>THRESHOLD VOLTAGE?, may include sensing the parasitic voltage signal 22 (VP) when the power transistor 12 is operated in response to a control signal 28 (VC) and indicating when the parasitic voltage value of the parasitic voltage signal 22 (VP) is greater than a turn-on threshold value VON and/or indicating when the parasitic voltage value is less than a turn-off threshold value VOFF. Optionally, the parasitic voltage value may be analyzed for a rate of change of the parasitic voltage signal 22 (VP), and so the power transistor could be operated based on the rate of change of the parasitic voltage signal 22 (VP) instead of or in cooperation with a voltage level of the parasitic voltage signal 22 (VP).

Step 350, DETERMINE THRESHOLD VOLTAGE, may include determining a threshold voltage VT of the power transistor 12 based on the parasitic voltage value or a rate of change of VP and/or a control signal (VC) value.

Accordingly, a system 10, and a method 300 for operating a power transistor is provided. The system and method described herein takes advantage of the inherent parasitic inductances in the packaging of power transistors and the inductances of the interconnecting conductors between the packages and other associated circuitry to identify the time points and gate voltages at which power transistor conduction is changing. This information can be utilized immediately or stored between switch cycles to allow predictive behaviors in switching efficiency optimization and other advanced switching and gate voltage control functions. Up until recently, power transistor operation was such that the effects of the parasitic impedances that were always present could be ignored, but recent increases in switching speeds and current levels now cause these parasitic impedances to have a significant effect on power transistor operation While this invention has been described in terms of the preferred embodiments thereof, it is not intended to be so limited, but rather only to the extent set forth in the claims that follow.

We claim:

1. A system for operating a power transistor, said system comprising:
    said power transistor that defines a gate contact, a collector contact, and an emitter contact, said power transistor characterized as having a threshold voltage;
    a circuit board that defines a control signal path electrically coupled to the gate contact, an input signal path electrically coupled to the collector contact, and an output signal path electrically coupled to the emitter contact, wherein said output signal path is characterized as having a parasitic impedance effective to generate a parasitic voltage signal in response to operating the power transistor; and
    a controller electrically connected to the circuit board in a manner effective to determine a parasitic voltage value based on the parasitic voltage signal, said controller configured to output a control signal effective to operate the power transistor based on the parasitic voltage value.

2. The system in accordance with claim 1, wherein the controller is further configured to determine said threshold voltage of the power transistor based on the parasitic voltage value and a control signal value.

3. The system in accordance with claim 1, wherein the parasitic impedance includes an inductance.

4. The system in accordance with claim 1, wherein the parasitic voltage value is indicative of a rate of change of a collector current.

5. The system in accordance with claim 1, wherein the output signal path includes a first contact and a second contact spaced electrically apart from the first contact by a portion of the output signal path, and the parasitic impedance is determined by the portion therebetween.

6. The system in accordance with claim 5, wherein the first contact is characterized as being electrically close to the emitter contact.

7. The system in accordance with claim 5, wherein the portion does not include an electrical component.

8. The system in accordance with claim 1, wherein the system further comprises a threshold detector configured to indicate when the parasitic voltage value is greater than a turn-on threshold value.

9. The system in accordance with claim 1, wherein the system further comprises a threshold detector configured to indicate when the parasitic voltage value is less than a turn-off threshold value.

10. The system in accordance with claim 1, wherein the system further comprises a rate of change detector configured to indicate when the rate of change of the parasitic voltage value is greater than a turn-on threshold rate value.

11. The system in accordance with claim 1, wherein the system further comprises a rate of change detector configured to indicate when the rate of change of the parasitic voltage value is less than a turn-off threshold rate value.

12. A method for operating a power transistor, said method comprising:
- providing said power transistor that defines a gate contact, a collector contact, and an emitter contact, said power transistor characterized as having a threshold voltage;
- providing a circuit board that defines a control signal path electrically coupled to the gate contact, an input signal path electrically coupled to the collector contact, and an output signal path electrically coupled to the emitter contact, wherein the output signal path is characterized as having a parasitic impedance effective to generate a parasitic voltage signal in response to operating the power transistor;
- determining a parasitic voltage value based on the parasitic voltage signal when the power transistor is operated in response to a control signal; and
- operating the power transistor based on the parasitic voltage value.

13. The method in accordance with claim 12, wherein the method further comprises indicating when the parasitic voltage value is greater than a turn-on threshold value.

14. The method in accordance with claim 12, wherein the method further comprises indicating when the parasitic voltage value is less than a turn-off threshold value.

15. The method in accordance with claim 12, wherein the parasitic voltage value corresponds to a rate of change of the parasitic voltage signal.

16. The method in accordance with claim 12, wherein the method further comprises determining said threshold voltage of the power transistor based on the parasitic voltage value and a control signal value.

\* \* \* \* \*